United States Patent [19]

Matsui

[11] Patent Number: 4,740,718

[45] Date of Patent: Apr. 26, 1988

[54] BI-CMOS LOGIC CIRCUIT

[75] Inventor: Masataka Matsui, Tokyo, Japan

[73] Assignee: Kabushiki Kaisha Toshiba, Kawasaki, Japan

[21] Appl. No.: 31,923

[22] Filed: Mar. 30, 1987

[30] Foreign Application Priority Data

Apr. 26, 1986 [JP] Japan .................................. 61-97428

[51] Int. Cl.⁴ .................... H03K 19/01; H03K 19/003; H03K 19/082; H03K 19/094
[52] U.S. Cl. .................................... 307/446; 307/443; 307/570; 307/279
[58] Field of Search ............... 307/446, 475, 450, 451, 307/570, 571, 279, 270, 443, 454

[56] References Cited

U.S. PATENT DOCUMENTS

| 4,616,146 | 10/1986 | Lee et al. ........................... 307/446 |
| 4,649,295 | 3/1987 | McLaughlin et al. .............. 307/446 |
| 4,661,723 | 4/1987 | Masuda et al. ..................... 307/446 |
| 4,694,203 | 9/1987 | Uragami et al. .................... 307/446 |

OTHER PUBLICATIONS

Japanese Patent Disclosure (KOKAI) No. 59-25423, Feb. 9,1984.

Primary Examiner—Stanley D. Miller
Assistant Examiner—David R. Bertelson
Attorney, Agent, or Firm—Finnegan, Henderson, Farabow, Garrett and Dunner

[57] ABSTRACT

A Bi-CMOS logic circuit having a totem pole-type output buffer, a CMOS logic circuit, and a latch circuit. The output buffer comprises a pull-up NPN bipolar transistor and a pull-down NPN bipolar transistor. The CMOS logic circuit controls the base current of the pull-up NPN bipolar transistor. The latch circuit controls the base current of the pull-down NPN bipolar transistor. The latch circuit includes at least two N-type MOSFETs. The first MOSFET has a gate coupled to the input terminal of the CMOS logic circuit, a drain connected to the node of the first and second NPN bipolar transistors, and a source coupled to the base of said second NPN bipolar transistor. The second MOSFET has a drain coupled to the input terminal of the CMOS logic circuit, a gate connected to the node of the first and second NPN bipolar transistors, and a source coupled to the base of said second NPN bipolar transistor.

10 Claims, 2 Drawing Sheets

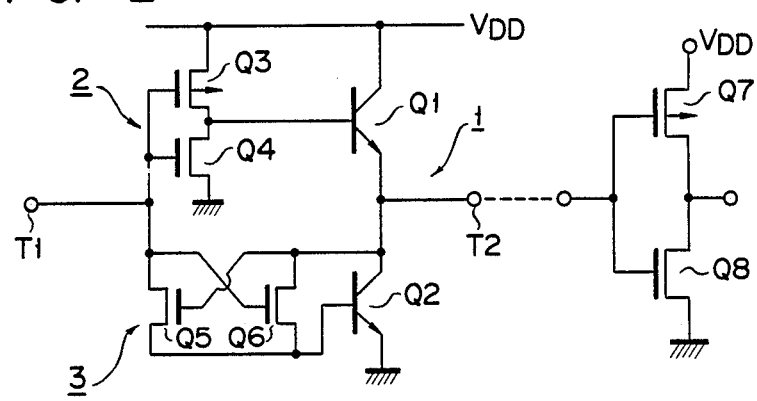
F I G. 2
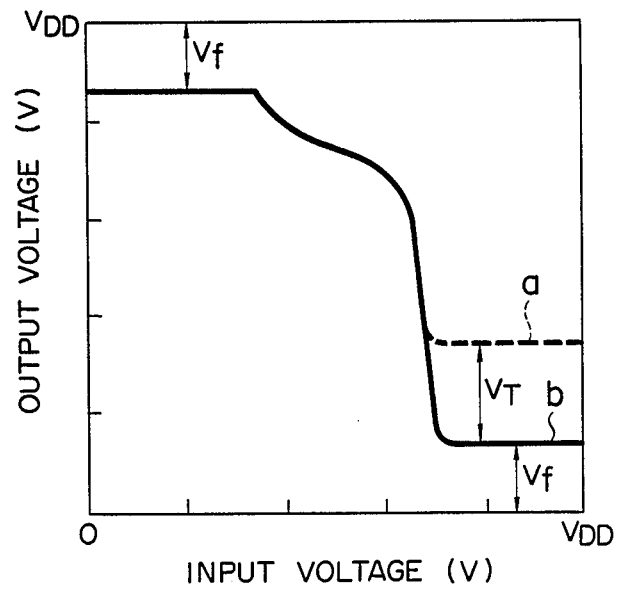
F I G. 3

BI-CMOS LOGIC CIRCUIT

BACKGROUND OF THE INVENTION

The present invention relates to a Bi-CMOS logic circuit comprising a bipolar transistor device and a CMOS transistor device which are formed on the same substrate, and more particularly, to a Bi-CMOS logic circuit used in the form of a semiconductor logic circuit for operating a circuit of a large output-load, such as an LSI memory.

An example of a Bi-CMOS logic circuit as described above, is disclosed in Japanese Patent Disclosure (KOKAI) No. 59-254223, published on Feb. 9, 1984.

This Bi-CMOS logic circuit is characterized in that the supply of base current to a totem pole-type output buffer is controlled by a CMOS device. FIG. 1 shows the Bi-CMOS logic circuit which operates as an inverter. As is shown in this figure, the totem pole-type output buffer comprises pull-up NPN bipolar transistor Q1 and pull-down NPN bipolar transistor Q2. The base of transistor Q2 is coupled to the output terminal of a CMOS inverter consisting of P-type MOSFET Q3 and N-type MOSFET Q4. P-type MOSFET Q3 is used to supply a base current to bipolar transistor Q1 so that the logic circuit outputs data "1". N-type MOSFET Q4 is used to pull a base charge from bipolar transistor Q1 so that the logic circuit outputs data "0". The base of pull-down NPN bipolar transistor Q2 is connected to the source of N-type MOSFET Q5 which is turned on or off by the potential at the node of bipolar transistors Q1 and Q2.

When the input signal supplied to input terminal IN is at "0" level, the output potential of the CMOS inverter comprising MOSFETs Q3 and Q4 is at "1" level. In this case, transistor Q1 is on, as, therefore, is MOSFET Q5. As the input signal rises from "0" level to "1" level, MOSFET Q5 remains on. A base current is, therefore, supplied to transistor Q2 from an input stage. On the other hand, as the input signal falls from "1" level to "0" level, MOSFET Q5 also remains on. Hence, the base charge is pulled from transistor Q2 to the input stage.

The Bi-CMOS logic circuit has no DC paths, unlike a logic circuit comprising only bipolar transistors. Its power consumption is, therefore, as small as that of a CMOS logic circuit. Furthermore, since it has a current buffer composed of bipolar transistors, it can provide a greater drive-current than a logic circuit comprising only a CMOS device. For the same reason, it can operate at as high a speed as a bipolar logic circuit.

The Bi-CMOS logic circuit shown in FIG. 1 is, however, disadvantageous in the following respect:

When the gate-source voltage of N-type MOSFET Q5 falls below its threshold voltage $V_T$ (about 1 V), during the operation in which the output signal of "0" level is generated, transistor Q5 is inevitably turned off. Consequently, the output potential cannot fall below $V_T + V_F$, where VF is the base-emitter voltage of transistor Q2 and is usually about 0.7 V. Hence, when the Bi-CMOS logic circuit drives a CMOS logic circuit, the "0" output level can be higher, in some cases, than the gate threshold voltage of the next-stage N-type MOSFET. In such a case, the current component flowing from the power supply terminal of the CMOS logic circuit to the ground thereof will increase, resulting in considerable power consumption in the CMOS logic circuit.

SUMMARY OF THE INVENTION

The object of the present invention is to provide a Bi-CMOS logic circuit whose "0" output level is low enough to drive a next-stage CMOS logic circuit, without increasing the current component flowing from the power supply terminal of the CMOS logic circuit to the ground thereof, and which therefore consumes little power and can operate at high speed.

According to the invention, the above object can be accomplished by using a bipolar totem pole-type output buffer comprising a pull-up NPN bipolar transistor and a pull-down NPN bipolar transistor, a CMOS logic circuit for controlling the base current of the pull-up NPN bipolar transistor, and latch means for controlling the base current of the pull-down NPN bipolar transistor.

The latch means includes at least one pair of first and second N-type MOSFETs. The first N-type MOSFET has a gate coupled to the input terminal of the CMOS logic circuit, a drain connected to the node of the NPN bipolar transistors, and a source coupled to the base of the pull-down NPN bipolar transistor. The second N-type MOSFET has a drain connected to the input terminal of the CMOS logic circuit, a gate coupled to the node of the NPN bipolar transistors or to the output terminal of the CMOS logic circuit, and a source coupled to the base of the pull-down NPN bipolar transistor. When the Bi-CMOS logic circuit provides "0" output, the latch means short-circuits the collector and base of the pull-down NPN bipolar transistor, thereby to lower the "0" output level of the Bi-CMOS logic circuit to the base-emitter voltage $V_F$ of the pull-down NPN bipolar transistor. Hence, the Bi-CMOS logic circuit can drive the next-stage CMOS logic circuit without increasing the current component flowing from the power supply terminal of the next-stage CMOS logic circuit to the ground thereof. The Bi-CMOS logic circuit of the present invention can therefore operate at high speed, and consumes only a small amount of power.

BRIEF DESCRIPTION OF THE DRAWINGS

FIG. 2 is a circuit diagram of a Bi-CMOS logic circuit according to a first embodiment of the present invention;

FIG. 3 is a graph showing the input-output DC characteristic of the Bi-CMOS logic circuit shown in FIG. 2, and also showing the input-output DC characteristic of the conventional Bi-CMOS logic circuit illustrated in FIG. 1;

DETILED DESCRIPTION OF THE PREFERRED EMBODIMENTS

Figure 1:
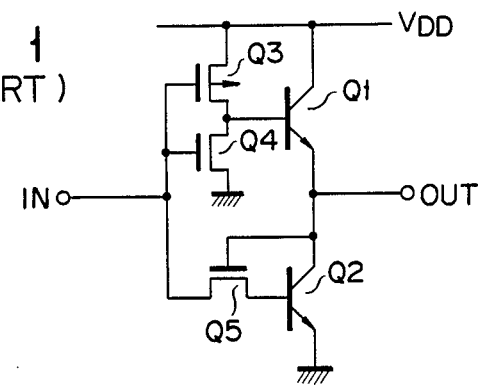
FIG. 1 is a circuit diagram showing a conventional Bi-CMOS logic circuit.

FIG. 2 is a circuit diagram of a Bi-CMOS logic circuit according to a first embodiment of the present invention. This circuit is a Bi-CMOS inverter.

As is shown in FIG. 2, input terminal T1 is connected to the gate of P-type MOSFET Q3 and also to the gate of N-type MOSFET Q4. The source of N-type MOS- FET Q4 is grounded. The source of MOSFET Q3 is coupled to positive power supply $V_{DD}$. The drain of MOSFET Q3 is coupled to the drain of MOSFET Q4. These MOSFETs Q3 and Q4 constitute CMOS inverter 2. The drain of MOSFET Q3 is connected to the base of pull-up NPN bipolar transistor Q1. The collector of transistor Q1 is connected to positive power supply $V_{DD}$. The emitter of transistor Q1 is coupled to output terminal T2 and also to the collector of pull-down bipolar NPN transistor Q2. The emitter of transistor Q2 is grounded. Transistors Q1 and Q2 constitute output buffer 1 of bipolar totem pole type.

Output terminal T2 is connected to the gate of N-type MOSFET Q5 and also to the drain of N-type MOSFET Q6. The sources of MOSFETs Q5 and Q6 are coupled to the base of transistor Q2. The drain of MOSFET Q5 is input terminal T1. The gate of transistor Q6 is coupled to input terminal T1, too. MOSFETs Q5 and Q6 constitute latch circuit 3. In this latch circuit 3, MOSFET Q5 mainly functions to extract base charge from transistor Q2, whereas MOSFET Q6 chiefly operates to supply base current to transistor Q2. It is therefore desirable that MOSFET Q6 have as great a conductance as is possible. MOSFET Q5 need not have so great a conductance as MOSFET Q6.

The operation of the Bi-CMOS inverter shown in FIG. 2 will now be explained. When the input signal supplied to input terminal T1 is at "0" level, the output of CMOS inverter 2 is at "1" level, i.e., at power supply potential $V_{DD}$. Hence, transistor Q1 of output buffer 1 is on, and the potential of output terminal T2 is at "1" level, or $V_{DD}-V_F$, where VF is the base-emitter voltage of NPN bipolar transistor Q1. In this case, MOSFETs Q6 and Q5 of latch circuit 3 are off and on, respectively. The base potential of bipolar transistor Q2 is at "0" level, and this transistor Q2 is thus off. As a result, no current components flow through output buffer 1 of totem pole type. Nor does any current component flow through CMOS inverter 2 or through latch circuit 3. Therefore, the current component flowing through the Bi-CMOS logic circuit is as small as the current component flowing through a CMOS logic circuit, as long as the input signal remains at "0" level.

When the input signal rises from "0" level to "1" level, a base current is supplied from input terminal T1 to transistor Q2 through transistor Q5 which is temporarily on. Transistor Q2 is thereby turned on, whereby the output of buffer 1 starts falling. Latch circuit 3 therefore undergoes inversion. That is, MOSFET Q5 is turned off, and MOSFET Q6 is turned on. A current is then bypassed from output terminal T2 to the base of transistor Q2. Thus, transistor Q2 keeps on operating.

As the potential at the output terminal of CMOS inverter 2 falls to "0" level, transistor Q1 is turned off. The collector and base of transistor Q2 are short-circuited since MOSFET Q6 has a sufficiently large conductance. Therefore, the output of this Bi-CMOS inverter falls to the base-emitter voltage $V_F$ of transistor Q2, unlike the output of the conventional Bi-CMOS inverter. The base potential of transistor Q2 never rises above the collector potential of transistor Q2 due to the on-resistance of MOSFET Q6, even if the collector current of transistor Q2 is bypassed to the base of transistor Q2. For this reason, transistor Q2 can hardly be saturated. When the input signal is at "1" level, transistor Q1 is off. Hence, in this case, the current component flowing through the Bi-CMOS inverter is as small as the current component flowing through a CMOS logic circuit.

On the other hand, when the input signal falls from "1" level to "0" level, the output of CMOS inverter 2 rises to "1" level. Transistor Q1 is thus turned on, whereby the potential at output terminal T2 rises. As this potential rises, latch circuit 3 undergoes inversion. As a result, MOSFET Q6 is turned off, and MOSFET Q5 is turned on. The base current flows from transistor Q2 to input terminal T1, and transistor Q2 is thus turned off. Consequently, the potential at the output terminal T2 rises to "1" level, i.e., $V_{DD}-V_F$.

FIG. 3 is a graph illustrating the input-output characteristic of the Bi-CMOS inverter shown in FIG. 2. In this figure, curve "b" shows this characteristic, and curve "a" represents the input-output characteristic of the conventional Bi-CMOS inverter shown in FIG. 1. As can be understood from FIG. 3, the Bi-CMOS inverter of this invention can lower the "0" level potential to $V_F$, whereas the "0" level potential provided by the conventional Bi-CMOS inverter (FIG. 1) is $V_T+V_F$. This means that the Bi-CMOS inverter has a more reliable input-output characteristic. Hence, when output terminal T2 is coupled to a CMOS inverter comprised of, for example, P-type MOSFET Q7 and N-type MOSFET Q8, as is illustrated in FIG. 2, and the output of the Bi-CMOS inverter drives this CMOS inverter, there will be no increase in the current flowing through this CMOS inverter.

As has been described, latch circuit 3 is used to control the base current of pull-down bipolar transistor Q2. Thus, a base current is supplied to transistor Q2 through MOSFET Q5 which is temporarily on, thereby to drive transistor Q2. When latch circuit 3 undergoes inversion, the collector current of transistor Q2 is bypassed and supplied as a base current to transistor Q2. Therefore, the time that the output of the Bi-CMOS inverter requires to falls from "1" level to "0" level is shorter than in the conventional Bi-CMOS inverter. Obviously, the Bi-CMOS inverter of the present invention can operate at high speed.

Figure 4:
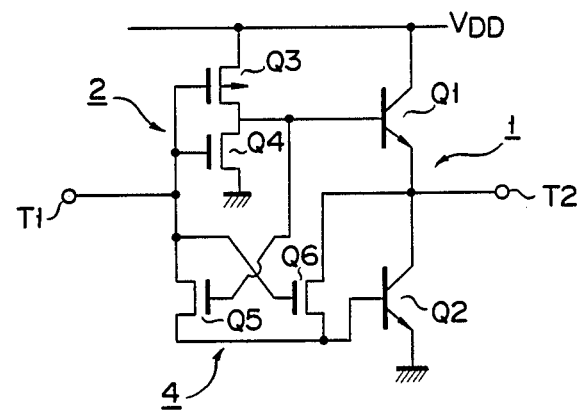
FIG. 4 is a circuit diagram showing another Bi-CMOS logic circuit according to a second embodiment of the present invention.

FIG. 4 shows another Bi-CMOS inverter according to the present invention. This Bi-CMOS inverter is different from the Bi-CMOS inverter of FIG. 2 only in that the gate of N-type MOSFET Q5 is not coupled to output terminal T2, but to the output terminal of CMOS inverter 2, i.e., the node of the drain of MOSFET Q3 and the drain of MOSFET Q4. Also in this Bi-CMOS inverter, the potential at the output terminal of CMOS inverter 2 changes as the potential at output terminal T2 changes, always with a difference of $V_F$ with respect to the potential at terminal T2. Circuit 4 comprised of MOSFETs Q5 and Q6 therefore functions as a latch circuit as in the Bi-CMOS inverter shown in FIG. 2.

The Bi-CMOS inverter shown in FIG. 4 has the same input-output characteristic as the Bi-CMOS inverter of FIG. 2. Since the gate of MOSFET Q5 is connected to the output terminal of CMOS inverter 2, the gate input of MOSFET Q5 is at the ground potential when the input signal is at "1" level. For this reason, MOSFET Q5 has a better off-characteristic than in the circuit of FIG. 2 wherein the gate input of MOSFET Q5 is $V_F$. Therefore, the current, which flows from input terminal T1 to the ground through MOSFET Q5 and then through the base-emitter path of bipolar transistor Q2 when the input signal is at "1" level, is small.

Figure 5:
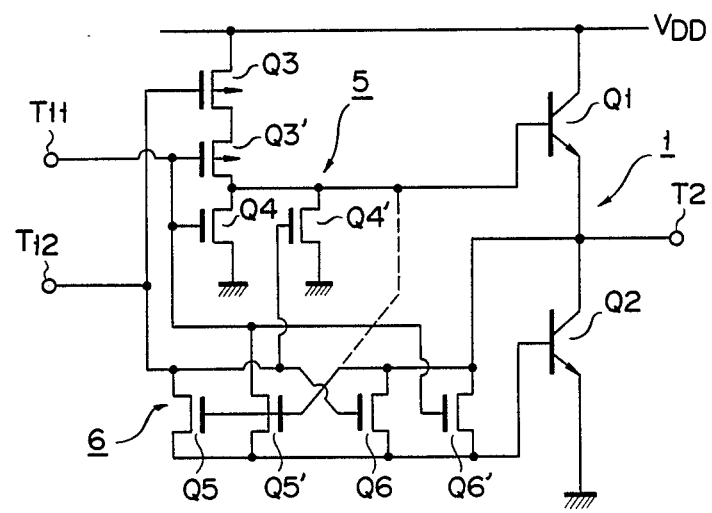
FIG. 5 is a circuit diagram showing still another Bi-CMOS logic circuit according to a third embodiment of the present invention.

FIG. 5 shows a Bi-CMOS, two-input NOR circuit according to a third embodiment of the invention. The NOR circuit comprises two NPN bipolar transistors Q1 and Q2, two P-type MOSFETs Q3 and Q3', and six N-type MOSFETs Q4, Q4', Q5, Q5', Q6 and Q6'. Bipolar transistors Q1 and Q2 constitute output buffer 1 of bipolar totem pole type. MOSFETs Q3, Q3', Q4 and Q4' constitute CMOS two-input NOR circuit 5. N-type MOSFETs Q5, Q5', Q6 and Q6' constitute latch circuit 6. The drain of MOSFET Q5' is coupled to the first input terminal T11 of NOR circuit 5. The drain of MOSFET Q5 is connected to the second input terminal T12 of NOR circuit 5. The gates of both MOSFETs Q5 and Q5' are coupled to output terminal T2 of output buffer 1. The sources of these MOSFETs are coupled the base of pull-down NPN bipolar transistor Q2. The gate of MOSFET Q6' is coupled to the first input terminal T11 of NOR circuit 5. The gate of MOSFET Q6 is connected to the second input terminal T12 of NOR circuit 5. The sources of MOSFETs Q6 and Q6' are coupled to the base of pull-down NPN bipolar transistor Q2. The drains of MOSFETs Q6 and Q6' are connected to output terminal T2. In latch circuit 6, MOSFETs Q5 and Q5' operate, mainly in order to pull base charge from transistor Q2, and MOSFETs Q6 and Q6' function, mainly in order to supply base current to transistor Q2. It is therefore desirable that MOSFETs Q6 and Q6' have a sufficiently great conductance. MOSFETs Q5 and Q5' need not have so great a conductance as MOSFET Q6.

In the NOR circuit illustrated in FIG. 5, when signals at "0" level is input to both input terminals T11 and T12, P-type MOSFETs Q3 and Q3' are turned on, and N-type MOSFETs Q4 and Q4' are turned off. The output of two-input NOR circuit 5 therefore rises to "1" level, and pull-up bipolar transistor Q1 is turned on. N-type MOSFETs Q6 and Q6' are thus turned off. Consequently, the potential at output terminal T2 rises to "1" level. On the other hand, when a signal at "1" level is input to input terminal T11 and/or input terminal T12, both MOSFETs Q3 and Q3', which are connected in series, cannot be turned on. At least one of the parallelly connected transistors, i.e., Q4 and Q4', is turned on. The output of NOR circuit 5 therefore falls to "0" level, whereby transistor Q1 is turned off. In this case, transistor Q2 is on since MOSFET Q6 or MOSFET Q6', or both are on. The potential at output terminal T2 is thus at "0" level. The Bi-CMOS NOR circuit shown in FIG. 5 indeed operates as a NOR circuit. Like the Bi-CMOS inverter described above, it can provide a "0" level output signal lower to voltage $V_F$.

Also in this Bi-CMOS two-input NOR circuit, the gates of N-type MOSFETs Q5 and Q5' can be connected, as in the embodiment of FIG. 4, to the output terminal of CMOS two-input NOR circuit 5 as is indicated by the broken lines (FIG. 5), not to the node of NPN bipolar transistors Q1 and Q2 as in the embodiment of FIG. 5.

What is claimed is:

1. A Bi-CMOS logic circuit comprising:
  a totem pole-type output buffer including a first NPN bipolar transistor having a collector coupled to a power supply potential, an emitter and a base, and a second NPN bipolar transistor having a collector coupled to the emitter of said first NPN bipolar transistor via a node, an emitter coupled to a ground potential, and a base, a potential at the node of said first and second NPN bipolar transistors being used as an output signal;
  a CMOS logic circuit having at least one input terminal for receiving an input signal, and an output terminal which is connected to the base of said first NPN bipolar transistor; and
  latch means including at least one pair of first and second N-type MOSFETs, said first N-type MOSFET having a gate coupled to the input terminal of said CMOS logic circuit, a drain coupled to the node of said first and second NPN bipolar transistors, and a source coupled to the base of said second NPN bipolar transistor, and said second N-type MOSFET having a drain coupled to the input terminal of said CMOS logic circuit, a gate coupled to the node of said first and second NPN bipolar transistors, and a source coupled to the base of said second NPN bipolar transistor.

2. A Bi-CMOS logic circuit according to claim 1, wherein said CMOS logic circuit includes a one-input CMOS inverter circuit having an output terminal connected to the base of said first NPN bipolar transistor.

3. A Bi-CMOS logic circuit according to claim 1, wherein said CMOS logic circuit includes a CMOS NOR circuit having first and second input terminals, and an output terminal which is connected to the base of said first NPN bipolar transistor.

4. A Bi-CMOS logic circuit according to claim 3, wherein said latch means include two pairs of N-type MOSFETs, one of those pairs consists of said first and second N-type MOSFETs, and the other pair consists of third and forth N-type MOSFETs, said first N-type MOSFET having the gate coupled to said first input terminal of said CMOS NOR circuit, said second N-type MOSFET having the drain coupled to said first input terminal of said CMOS NOR circuit, said third N-type MOSFET having a gate coupled to said second input terminal of said CMOS NOR circuit, a drain coupled to the node of said first and second NPN bipolar transistors, and a source coupled to the base of said second NPN bipolar transistor, and said fourth N-type MOSFET having a drain coupled to said second input terminal of said CMOS NOR circuit, a gate coupled to the node of said first and second NPN bipolar transistors, and a source coupled to the base of said second NPN bipolar transistor.

5. A Bi-CMOS logic circuit according to claim 1, wherein said first N-type MOSFET has a conductance greater than that of said second N-type MOSFET.

6. A Bi-CMOS logic circuit comprising:
  a totem pole-type output buffer including a first NPN bipolar transistor having a collector coupled to a power supply potential, an emitter and a base, and a second NPN bipolar transistor having a collector coupled to the emitter of said first NPN bipolar transistor via a node, an emitter coupled to a ground potential and a base, a potential at the node of said first and second NPN bipolar transistors being used as an output signal;
  a CMOS logic circuit having at least one input terminal for receiving an input signal, and an output terminal which is connected to the base of said first NPN bipolar transistor; and
  latch means including at least one pair of first and second N-type MOSFETs, said first N-type MOSFET having a gate coupled to the input terminal of said CMOS logic circuit, a drain coupled to the node of said first and second NPN bipolar transistors, and a source coupled to the base of said second NPN bipolar transistor, and said second N- type MOSFET having a drain coupled to the input terminal of said CMOS logic circuit, a gate coupled to the output terminal of said CMOS logic circuit, and a source coupled to the base of said second NPN bipolar transistor.

7. A Bi-CMOS logic circuit according to claim 6, wherein said CMOS logic circuit includes a one-input CMOS inverter circuit having an output terminal connected to the base of said first NPN bipolar transistor.

8. A Bi-CMOS logic circuit according to claim 6, wherein said CMOS logic circuit includes a CMOS NOR circuit having first and second input terminals, and an output terminal which is connected to the base of said first NPN bipolar transistor.

9. A Bi-CMOS logic circuit according to claim 8, wherein said latch means include two pairs of N-type MOSFETs, one of those pairs consists of said first and second N-type MOSFETs, and the other pair consists of third and fourth N-type MOSFETs, said first N-type MOSFET having the gate coupled to said first input terminal of said CMOS NOR circuit, said second N-type MOSFET having the drain coupled to said first input terminal of said CMOS NOR circuit, said third N-type MOSFET having a gate coupled to said second input terminal of said CMOS NOR circuit, a drain coupled to the node of said first and second NPN bipolar transistors, and a source coupled to the base of said second NPN bipolar transistor, and said fourth N-type MOSFET having a drain coupled to said second input terminal of said CMOS NOR circuit, a gate coupled to the output terminal of said CMOS NOR circuit, and a source coupled to the base of said second NPN bipolar transistor.

10. A Bi-CMOS logic circuit according to claim 6, wherein said first N-type MOSFET has a conductance greater than that of said second N-type MOSFET.

* * * * *